United States Patent
Sun et al.

(10) Patent No.: US 7,718,029 B2
(45) Date of Patent: May 18, 2010

(54) SELF-PASSIVATING PLASMA RESISTANT MATERIAL FOR JOINING CHAMBER COMPONENTS

(75) Inventors: Jennifer Y. Sun, Sunnyvale, CA (US); Li Xu, San Jose, CA (US); Senh Thach, Union City, CA (US); Kelly A. McDonough, San Jose, CA (US); Robert Scott Clark, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 11/461,689

(22) Filed: Aug. 1, 2006

(65) Prior Publication Data

US 2008/0029211 A1  Feb. 7, 2008

(51) Int. Cl.
C04B 37/00 (2006.01)
B29C 65/00 (2006.01)
B32B 37/00 (2006.01)
B32B 38/04 (2006.01)
H01L 21/00 (2006.01)

(52) U.S. Cl. .................. 156/325; 156/272.6; 438/118
(58) Field of Classification Search .............. 156/272.6, 156/325; 438/118
See application file for complete search history.

(56) References Cited

U.S. PATENT DOCUMENTS

| | | | |
|---|---|---|---|
| 5,074,456 A | 12/1991 | Degner et al. | |
| 6,063,207 A * | 5/2000 | Yu et al. | 134/2 |
| 6,508,911 B1 | 1/2003 | Han et al. | |
| 6,983,892 B2 | 1/2006 | Noorbakhsh et al. | |
| 7,048,814 B2 | 5/2006 | Lin et al. | |
| 2002/0043335 A1 | 4/2002 | Yamaguchi et al. | |
| 2003/0029563 A1 * | 2/2003 | Kaushal et al. | 156/345.1 |
| 2003/0056897 A1 | 3/2003 | Shamouilian et al. | |
| 2003/0150530 A1 | 8/2003 | Lin et al. | |
| 2005/0003675 A1 | 1/2005 | Carducci | |

FOREIGN PATENT DOCUMENTS

| EP | 1 475 820 A1 | 11/2004 |
|---|---|---|
| EP | 1475820 | 11/2004 |

OTHER PUBLICATIONS

European Search Report from EP 07015108; dated Jan. 16, 2008; copy consists of 2 pages; (APPM/11219EP).
Official Letter of Korean Patent Application No. 10-2007-0077371 dated May 8, 2009 from Korean Patent Office. A concise statement of relevance is provided.

* cited by examiner

*Primary Examiner*—Philip C Tucker
*Assistant Examiner*—Michael N Orlando
(74) *Attorney, Agent, or Firm*—Patterson & Sheridan, LLP

(57) ABSTRACT

Embodiments of the invention provide a robust bonding material suitable for joining semiconductor processing chamber components. Other embodiments provide semiconductor processing chamber components joined using a bonding material having metal filler disposed in an adhesive layer. Other embodiments include methods for manufacturing a semiconductor processing chamber component having a bonding material that includes metal filled disposed in an adhesive layer. The metal filler is suitable for reacting with halogen containing plasmas such that a halogen based metal layer is formed on the exposed portion of the bonding material upon exposure to the plasma.

10 Claims, 2 Drawing Sheets

SELF-PASSIVATING PLASMA RESISTANT MATERIAL FOR JOINING CHAMBER COMPONENTS

BACKGROUND OF THE INVENTION

1. Field of the Invention

Embodiments of the invention generally relate to a semiconductor processing chamber, more specifically, to a bonding material suitable for joining semiconductor processing chamber components.

2. Description of the Related Art

Semiconductor processing involves a number of different chemical and physical processes whereby minute integrated circuits are created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or any other appropriate materials.

A typical semiconductor processing chamber may have many components. Some components include a chamber body defining a process zone, a gas distribution assembly adapted to supply a process gas from a gas supply into the process zone, a gas energizer, e.g., a plasma generator, utilized to energize the process gas within the process zone, a substrate support assembly, and a gas exhaust. Some components may be comprised of an assembly of parts. For example, the substrate support assembly may include a conductive base adhesively bonded to a ceramic chuck while the gas distribution assembly may include a ceramic gas distribution plate bonded to a conductive base. Effective bonding of the parts requires a suitable adhesive and a unique bonding technique to ensure that the parts are securely attached to each other while compensating for any mismatch in thermal expansion and without adversely creating any interfacial defects.

Many semiconductor processes used to produce integrated circuits employ halogen, halogen containing gases and/or plasmas. For example, a halogen or halogen containing gas may be energized to etch, remove or deposit a layer on the substrate surface. The energized halogen or halogen containing gas generally is highly corrosive and has aggressive ions which attack exposed portions of the chamber components. Additionally, kinetically energized ionic and radical species bombard the exposed portions, thereby eroding the chamber components.

Erosion and gradual degradation of the chamber components due to plasma exposure may create gaps and/or openings between bonded components. As the gap in between each component becomes widened, the plasma generated in the process chamber may travel into the gap and attack the parts utilized to assemble the component. In particular, conventional bonding materials utilized to join parts of the components are specially susceptible to this kind of attack and erosion, thereby degrading the interfacial joint, creating interfacial voids and surface defects. Eroded or missing bonding material may accelerate the disassembly of the parts and reduce the lifespan of the chamber components. Additionally, flakes of the eroded bonding material, as well as the eroded parts of the chamber component may become a source of particulate contamination during substrate processing. Therefore, promoting the corrosion resistance of the bonding material utilized to assemble chamber components is desired to increase service life of the chamber components, reduce chamber downtime, reduce maintenance frequency and to improve substrate yields.

Therefore, there is a need for a robust bonding material utilized to assemble parts and/or components in a semiconductor processing chamber.

SUMMARY OF THE INVENTION

Embodiments of the invention provide a robust bonding material suitable for joining semiconductor processing chamber components. Other embodiments provide semiconductor processing chamber components joined using a bonding material having metal filler disposed in an adhesive layer. Other embodiments include methods for manufacturing a semiconductor processing chamber component having a bonding material that includes metal filled disposed in an adhesive layer. The metal filler is suitable for reacting with halogen containing plasmas such that a halogen based metal layer is formed on the exposed portion of the bonding material upon exposure to the plasma.

In one embodiment, a bonding material suitable for joining semiconductor chamber components includes an adhesive material having a metal filler. The metal filler is at least one of Al, Mg, Ti, Ta, Y and Zr.

In another embodiment, a semiconductor chamber component includes a first surface coupled to an adjacent second surface by a bonding material. The bonding material has a portion that remains exposed between the first and second surfaces. The bonding material includes an adhesive material having a metal filler. The metal filler is at least one of Al, Mg, Ti, Ta, Y and Zr.

In yet another embodiment, a bonding semiconductor processing chamber components includes applying a bonding material a surface of a first component, wherein the bonding material includes a metal filler intermixed with an adhesive material, coupling a second component to the surface of the first component through contact with the bonding material, and forming a halogen based metal layer on a surface of the bonding material exposed between the first and second components.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

Figure 1:
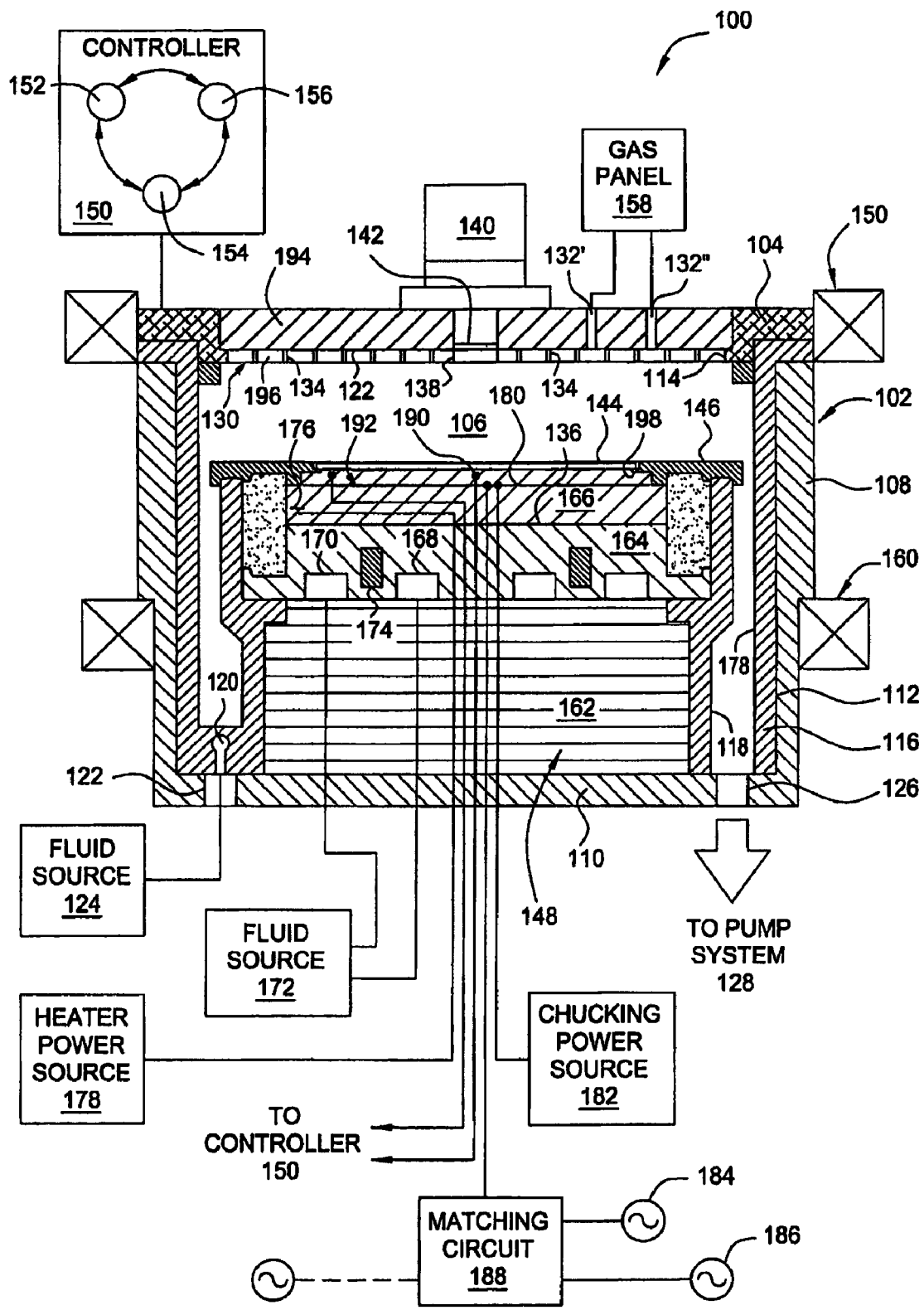
FIG. 1 depicts a sectional view of one embodiment of a processing chamber using a bonding material according the present invention.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

Embodiments of the invention provide a robust bonding material for joining parts utilized in a semiconductor processing chamber, processing chamber components bonded with the inventive bonding material and methods for manufacturing the same. In one embodiment, the robust bonding material is a plasma corrosion resist material utilized that is suitable for bonding parts in gas distribution assembly or substrate support assembly of a semiconductor processing chamber. The bonding material is an adhesive having metal fillers and provides a self-passivating layer formed when exposed to a halogen containing plasma.

FIG. 1 is a sectional view of one embodiment of a semiconductor processing chamber 100 having at least one component utilizing a bonding material according to the present invention. One examples of suitable processing chamber 100 may be a CENTURA® HART™ Etch System, available from Applied Materials, Inc of Santa Clara, Calif. It is contemplated that the other processing chambers may be adapted to benefit from one or more of the inventive techniques disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate access port (not shown) is generally defined in a side wall 108 and a selectively sealed by a slit valve to facilitate entry and egress of the substrate 144 from the processing chamber 100. An outer liner 116 may be coated on the side walls 108 of the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with Yttrium, Yttrium alloy or an oxide thereof. In yet another embodiment, the outer liner 116 is fabricated from bulk $Y_2O_3$.

An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one embodiment, the pump system 128 maintains the pressure inside the interior volume 106 at operating pressures typically between about 10 mTorr to about 20 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one embodiment, the window 142 is comprised of quartz or other suitable material that is transmissive to a signal utilized by an optical monitoring system 140. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. Examples of processing gases may include halogen-containing gas, such as $C_2F_6$, $SF_6$, $SiCl_4$, HBr, $NF_3$, $CF_4$, $Cl_2$, $CHF_3$, $CF_4$, and $SiF_4$, among others, and other gases such as $O_2$, or $N_2O$. Examples of carrier gases include $N_2$, He, Ar, other gases inert to the process and non-reactive gases. In the embodiment depicted in FIG. 1, inlet ports 132', 132" are provided in the lid 104 to allow gases to be delivered from the gas panel 158 to the interior volume 106 of the processing chamber 100.

A gas distribution assembly 130 is coupled to an interior surface 114 of the lid 104. The gas distribution assembly 130 generally includes a conductive base 194 (e.g., an electrode) and a gas distribution plate 196 bound by a bonding material 122 according to the present invention. In one embodiment, the conductive base 194 may be fabricated by aluminum, stainless steel or other suitable materials. The gas distribution plate 196 may be fabricated from a ceramic material, such as silicon carbide, bulk Yttrium or oxide thereof to provide resistance to halogen-containing chemistries. Alternatively, the gas distribution plate 196 may be coated with Yttrium or an oxide thereof to extend the life time of the gas distribution assembly 130.

The bonding material 122 may be applied to the lower surface of the conductive base 194 or the upper surface of the gas distribution plate 196 to mechanically bond or blaze the gas distribution plate 196 to the conductive base 194. In one embodiment, the bonding material 122 is a plasma resist material selected to prevent corrosion and/or damage during plasma processing. The bonding material 122 provides a bonding energy sufficient to securely join the conductive base 194 and the gas distribution plate 196. The bonding material 122 additionally provides a thermal conductivity sufficient to provide enough compliance to prevent delamination due to thermal expansion mismatch between the gas distribution plate 196 and the conductive base 194 when heated during plasma processing. It is contemplated that the bonding material 122 may also be used to bond other parts and/or components utilized to assemble the gas distribution assembly 130.

In one embodiment, the bonding material 122 may be a thermal conductive paste, glue, gel or pad having metal fillers added thereto to promote plasma resistance. The bonding materials may be applied to the interface in the form of an adhesive ring, adhesive beads, or the combination thereof. The gas distribution plate 196 may be a flat disc having a plurality of apertures 134 formed in the lower surface of the gas distribution plate 196 facing toward the substrate 144. The apertures 134 allow the gases to flow from the inlet port 132 (shown as 132', 132") through plenum (not shown) into the interior volume 106 of the processing chamber 100 in a predefined distribution across the surface of the substrate 144 being processed in the chamber 100.

The gas distribution assembly 130 may includes a region transmissive or passage 138 suitable for allowing the optical monitoring system 140 to view the interior volume 106 and/or substrate 144 positioned on the substrate support assembly 148. The passage 138 includes a window 142 to prevent gas leakage from the passage 138.

A substrate support assembly 148 is disposed in the interior volume 106 of the processing chamber 100 below the gas distribution assembly 130. The substrate support assembly 148 holds the substrate 144 during processing. The substrate support assembly 148 generally includes a plurality of lift pins (not shown) disposed therethrough that are configured to lift the substrate 144 from the support assembly 148 and facilitate exchange of the substrate 144 with a robot (not shown) in a conventional manner. An inner liner 118 may be coated on the periphery of the substrate support assembly 148. The inner liner 118 may be a halogen-containing gas resist material which is substantially similar material as the outer liner 116. In one embodiment, the inner liner 118 may be fabricated from the same materials of the outer liner 116.

In one embodiment, the substrate support assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among other, to the base 164 and chuck 166.

At least one of the base 164 or chuck 166 may include at least one optional embedded heater 176, at least one optional embedded isolator 174 and a plurality of conduits 168, 170 to control the lateral temperature profile of the support assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate supporting surface of the chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 144.

The electrostatic chuck 166 comprises at least one clamping electrode 180 controlled using a chucking power source 182. The electrode 180 (or other electrode disposed in the chuck 166 or base 164) may further be coupled to one or more RF power sources 184, 186 through a matching circuit 188 for maintaining a plasma formed form process and/or other gases within the processing chamber 100. The sources 184, 186 are generally capable of producing an RF signal having a frequency from about 50 kHz to about 3 GHz and a power of up to about 10,000 Watts.

The base 164 is bound to the electrostatic chuck 166 by a bonding material 136, which is substantially similar as the bonding material 122 utilized to bond the gas distribution plate 196 and the conductive base 194 in the gas distribution plate 130. As described above, the bonding material 136 facilitates thermal energy exchange between the electrostatic chuck 166 and the base 164 and compensates for the thermal expansion mismatch therebetween. In one exemplary embodiment, the bonding material 136 mechanically bonds the electrostatic chuck 166 to base 164. It is contemplated that the bonding material 136 may also be used to bond other parts and/or components utilized to assemble the substrate support assembly 148, such as bonding the base 164 to the mounting plate 162.

Figure 2:
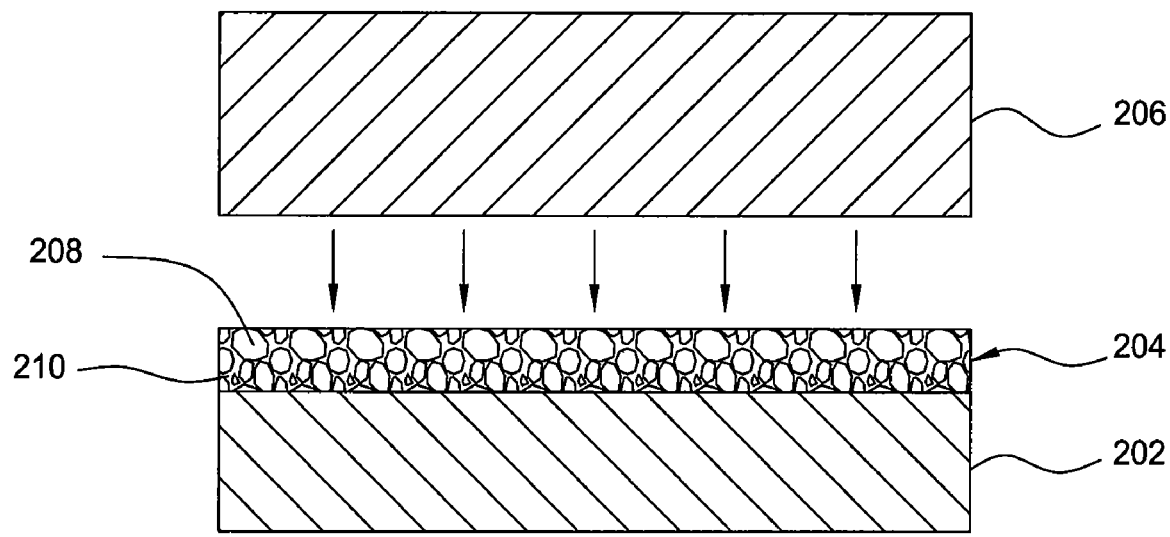
FIG. 2 depicts a sectional view of one embodiment with substrates being bound by a bonding material according the present invention.

FIG. 2 depicts a sectional view of one embodiment of a bonding material 204 utilized to bond a first surface 202 to a second surface 206. The surfaces 202, 206 may be defined on the gas distribution assembly 130 or substrate support assembly 148, or other chamber components exposed to the plasma. In one embodiment, the bonding material 204 may be the bonding material 122 utilized to bond the gas distribution plate 196 to the conductive base 194 in the gas distribution assembly 130, as shown in FIG. 1. In another embodiment, the bonding material 204 may be the bonding material 136 utilized to bond the base 164 to the electrostatic chuck 166 in the substrate support assembly 148. That is, the bonding material 204 may be the bonding material 122 or 136. It is contemplated that the bonding material 204 may be used to bond other parts utilized to assemble semiconductor processing chamber components, such as the processing chamber 100.

The bonding material 204 includes a base material 210 having metal fillers 208 mixed or added thereto. In one embodiment, the base material 210 may be an adhesive material in the form of a gel, glue, pad or paste. Some examples of suitable adhesive material include, but not limited to, acrylic and silicone based compounds. In another embodiment, suitable examples may include acrylic, urethane, polyester, polycaprolactone (PCL), polymethylmethacrylate (PMMA), PEVA, PBMA, PHEMA, PEVAc, PVAc, Poly N-Vinyl pyrrolidone, Poly(ethylene-vinyl alcohol), epoxy, resin, polyurethane, plastic or other polymer adhesive materials. The metal fillers 208 may be mixed with the base material 210 by centrifuge or other suitable manner.

The metal filler 208 may have a size that facilitates suspension in the base material 210. In one embodiment, the metal filler may have a mean diameter or projected area ranging between 0.2 µm and 2.5 µm. The mixing ratio of the metal filler 208 to the base material 210 is selected to allow the bonding material 204 to have good thermal conductivity. The metal filler 208 to base material 210 ratio may be between about 1:20 and about 1:1, for example, between about 1:10 to about 1:2.5 by weight percentage.

Figure 3:
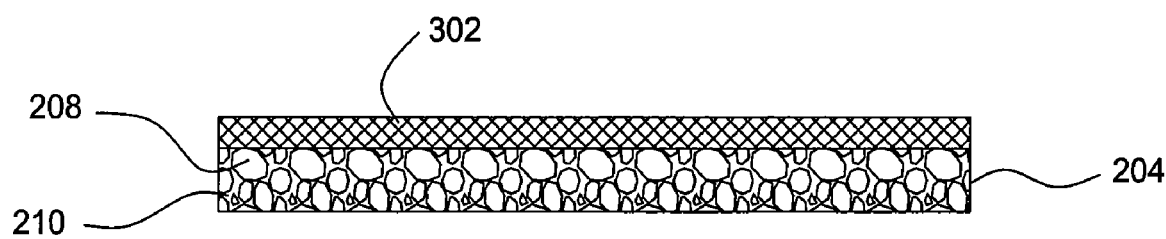
FIG. 3 depicts a sectional view of a bonding material having a self-passivating layer formed thereon.

The metal fillers 208 may be particles, powder, or flakes uniformly or randomly dispensed in the base material 210. The metal fillers 208 may comprise at least one of Al, Mg, Ta, Ti, Y and Zr. The metal fillers 208 mixed in the base material 210 have a high Gibbs free energy and are therefore capable of reacting with the halogen-containing gas forming from the plasma, thereby forming a halogen based metal layer 302, as shown in FIG. 3, such as $MF_x$, wherein M is Al, Mg, Ta, Ti, Y and Zr and x is an integral ranging between 1 and 5. The halogen based metal layer 302 serves as a passivating layer preventing further attack on the bonding material 204 by the plasma during processing, thereby promoting the surface corrosion resistance of the bonding material 204 and extending the service life of the chamber components. The formation of the halogen based metal layer 302 is a self limiting process, allowing the bonding material 204 to be self-passivated to the halogen based metal layer 302 if damaged by ion bombardment and exposed again to the halogen containing plasma. In the embodiment wherein the metal powder is aluminum (Al) and the formed halogen containing gas is $CF_4$, the halogen based metal layer is a $AlF_3$ layer.

In one embodiment, the bonding material 204 has a thickness selected sufficient to allow the first substrate 202 and the second substrate 206 to be securely bonded. The bonding material 204 provides a thickness sufficient to form the halogen based metal layer 302 on the surface of the bonding material 204 once exposed to the plasma. In one embodiment, the thickness of the bonding material is selected between about 50 µm and about 500 µm, such as between about 225 µm and about 350 µm. In another embodiment, the thickness of the bonding material is selected between about 50 µm and about 500 µm for assembling parts in the gas distribution plate 130, and between about 50 µm and about 400 µm for assembling parts in the substrate support assembly 148. The bonding material 204 may produce the halogen based metal layer 302 having a thickness between about 0.2 µm and about 2 µm during plasma processing.

Thus, a robust bonding material is provided that may be utilized to assembling parts for a semiconductor chamber. The robust bonding material advantageously provides a self-passiviating layer upon exposure to halogen containing plasma, thereby preventing the underlying bonding material being corroded and extending the life of the bonding material and/or chamber components.

While the foregoing is directed to embodiments of the present invention, other and further embodiments of the invention may be devised without departing from the basic scope thereof, and the scope thereof is determined by the claims that follow.

What is claimed is:

1. A semiconductor chamber component, comprising:
 a first surface disposed adjacent a second surface; and
 a bonding material coupling the first and second surfaces, wherein a portion of the bonding material between the first and second surfaces remains exposed to plasma during a plasma process, wherein the exposed portion reacts with a halogen containing gas supplied from the plasma, and wherein the bonding material further comprises:
  an adhesive material, wherein the adhesive material is an acrylic based compound; and
  metal filler added to the adhesive material, the metal filler being at least one of Mg, Ta and Zr.

2. The chamber component of claim 1, wherein the exposed portion reacts with the halogen containing gas supplied from the plasma further comprises:
 a halogen based metal layer formed thereon.

3. The chamber component of claim 2, wherein the halogen based metal layer has a formula of $MF_x$, wherein M is selected from a group consisting of Mg, Ta and Zr and x is an integer ranging from 1 to 5.

4. The chamber component of claim 1, wherein the adhesive material is in the form of paste, glue, gel, or pad.

5. The chamber component of claim 1, wherein the metal filler further comprises:
 particle, flake or power having a mean diameter or projected area of about 0.2 um to about 2.5 um.

6. The chamber component of claim 1 further comprising a ratio of metal filler to adhesive material of between about 1:20 and about 1:1 by weight percentage.

7. The chamber component of claim 1, wherein the first surface is a base of a gas distribution assembly and the second surface is a gas distribution plate.

8. The chamber component of claim 1, wherein the first surface is a base of a substrate support assembly and the second surface is an electrostatic chuck.

9. The chamber component of claim 1, wherein the first surface is ceramic and the second surface is metallic.

10. The chamber component of claim 1, wherein the bonding material has a thickness between about 50 um and about 500 um.

* * * * *